US008445976B2

(12) United States Patent
Yamazaki

(10) Patent No.: US 8,445,976 B2
(45) Date of Patent: May 21, 2013

(54) MICRO MOVABLE DEVICE

(75) Inventor: Hiroaki Yamazaki, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 168 days.

(21) Appl. No.: 12/853,544

(22) Filed: Aug. 10, 2010

(65) Prior Publication Data

US 2011/0127878 A1 Jun. 2, 2011

(30) Foreign Application Priority Data

Aug. 10, 2009 (JP) .............................. P 2009-186039

(51) Int. Cl.
*H01L 29/84* (2006.01)
*H01H 59/00* (2006.01)

(52) U.S. Cl.
USPC ....... 257/415; 257/E29.324; 438/50; 200/181

(58) Field of Classification Search
USPC .............. 257/415, E29.324; 438/50; 200/181
See application file for complete search history.

(56) References Cited

U.S. PATENT DOCUMENTS

| | | | | |
|---|---|---|---|---|
| 6,876,282 | B2 * | 4/2005 | Andricacos et al. | 335/78 |
| 7,414,500 | B2 * | 8/2008 | De Los Santos | 335/78 |
| 2001/0054937 | A1 * | 12/2001 | Hyvonen et al. | 333/32 |
| 2002/0191897 | A1 * | 12/2002 | Hallbjorner et al. | 385/18 |
| 2003/0119221 | A1 * | 6/2003 | Cunningham et al. | 438/52 |
| 2004/0061579 | A1 * | 4/2004 | Nelson | 335/78 |
| 2005/0206483 | A1 * | 9/2005 | Pashby et al. | 333/262 |
| 2008/0134785 | A1 | 6/2008 | Pruetz | |
| 2009/0289313 | A1 | 11/2009 | Yamazaki | |
| 2010/0038732 | A1 | 2/2010 | Yamazaki | |
| 2010/0315757 | A1 | 12/2010 | Yamazaki | |

FOREIGN PATENT DOCUMENTS

JP 2008145440 6/2008

OTHER PUBLICATIONS

Japanese Office Action of Notification of Reasons for Refusal for Application No. 2009-186039 Dated Feb. 26, 2013, 5 pgs.

* cited by examiner

*Primary Examiner* — Steven J Fulk
(74) *Attorney, Agent, or Firm* — Turocy & Watson, LLP

(57) ABSTRACT

A micro movable device according to an embodiment of the present invention may include a signal line formed on a support substrate, a ground line formed on the support substrate and arranged side by side with the signal line, a first driving electrode formed above the signal line, a second driving electrode formed above the ground line, a first auxiliary driving electrode arranged side by side with the first driving electrode, a second auxiliary driving electrode arranged side by side with the second driving electrode, and a movable electrode which is formed above the first driving electrode, the second driving electrode, the first auxiliary driving electrode and the second auxiliary driving electrode with a space therebetween, and which is supported on the support substrate.

7 Claims, 23 Drawing Sheets

MICRO MOVABLE DEVICE

CROSS REFERENCE TO RELATED APPLICATION

This application is based upon and claims the benefit of priority from Japanese Patent Application No. 2009-186039, filed on Aug. 10, 2009, the entire contents of which are incorporated herein by reference.

BACKGROUND

A micro electro mechanical system (MEMS) is configured by integrating a mechanical element, a sensor, an actuator, an electronic circuit and the like on the same substrate. The MEMS is utilized in a variety of fields such as a printer head and a pressure sensor.

Meanwhile, when the MEMS is used as a high-frequency device, there are a cold switching and a hot switching as a method for turning on and off a high-frequency signal transmitted via a signal line. The cold switching is a method for making a signal line on a ground line move up and down with the signal line receiving no high-frequency signal, while the hot switching is a method for making a signal line on a ground line move up and down with the signal line receiving a high-frequency signal.

In the hot switching, a self-holding phenomenon occurs when a signal line is made to transition from a down state to an up state. That is, in the hot switching, an electrostatic attraction is generated by the high-frequency signal, whereby the signal line is held in the down state independently of the drive signal which makes the signal line move up or down.

In order to avoid such a self-holding phenomenon, a spring constant of a support member supporting the signal line is increased so as to make the signal line transition from a down state to an up state against the electrostatic attraction generated by the high-frequency signal.

Meanwhile, for example, Japanese Patent Application Publication No. 2008-145440 discloses a method for setting a potential different from a potential of a size mass by providing an auxiliary electrode outside an electrode forming a capacitor in order to reduce an impact of the fluctuating surface load on an output signal of an inertial sensor of a micromachine structure.

However, when the spring constant of the support member supporting the signal line is increased to avoid the self-holding phenomenon, a drive voltage for making the signal line transition from an up state to a down state may be increased.

According to the method disclosed by Japanese Patent Application Publication No. 2008-145440, since the signal line and the ground line are placed facing each other, the electrostatic attraction depends on a gap between the signal line and the ground line. For this reason, the electrostatic attraction between the signal line and the ground line increases, and the size of the auxiliary electrode may be accordingly increased. This may cause a problem of increasing the parasitic capacitance between the signal line and the ground line.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

Figure 17A:
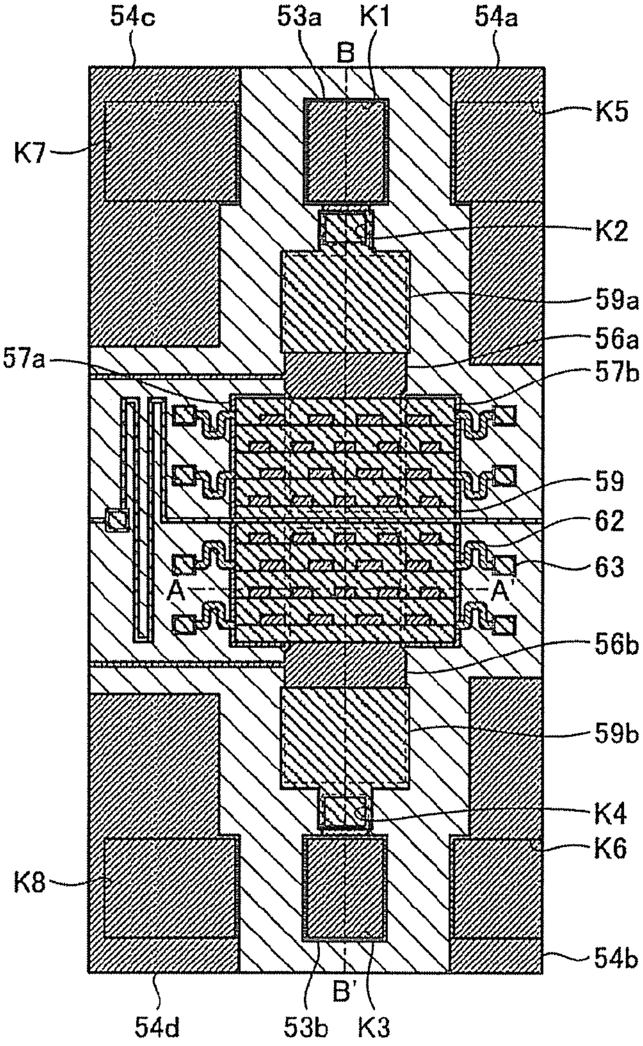
Figure 17C:
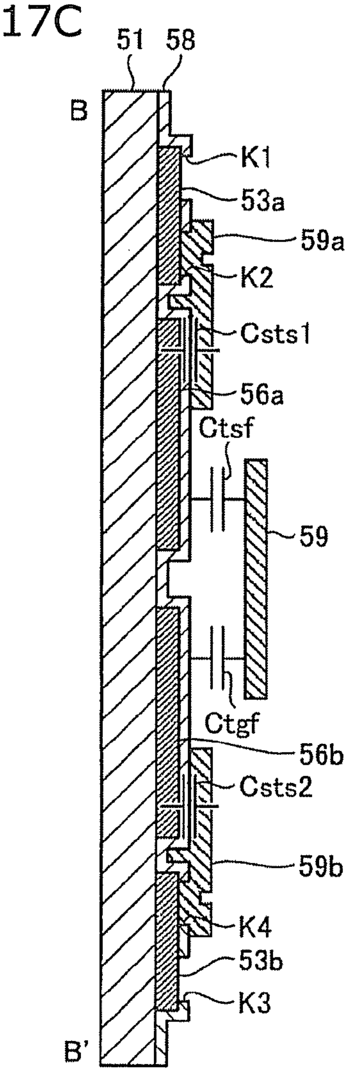
Figure 17B:
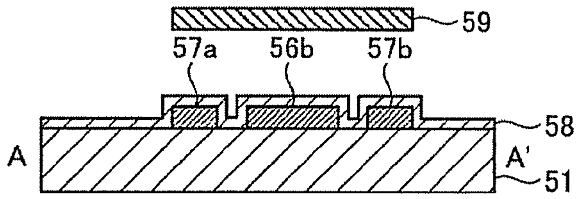

FIG. 17A is a plan view showing a schematic configuration of a micro movable device according to a fourth embodiment of the present invention. FIG. 17B is a cross-sectional view of the micro movable device taken along the A-A' line in FIG. 17A. FIG. 17C is a cross-sectional view of the micro movable device taken along the B-B' line in FIG. 17A.

Figure 18A:
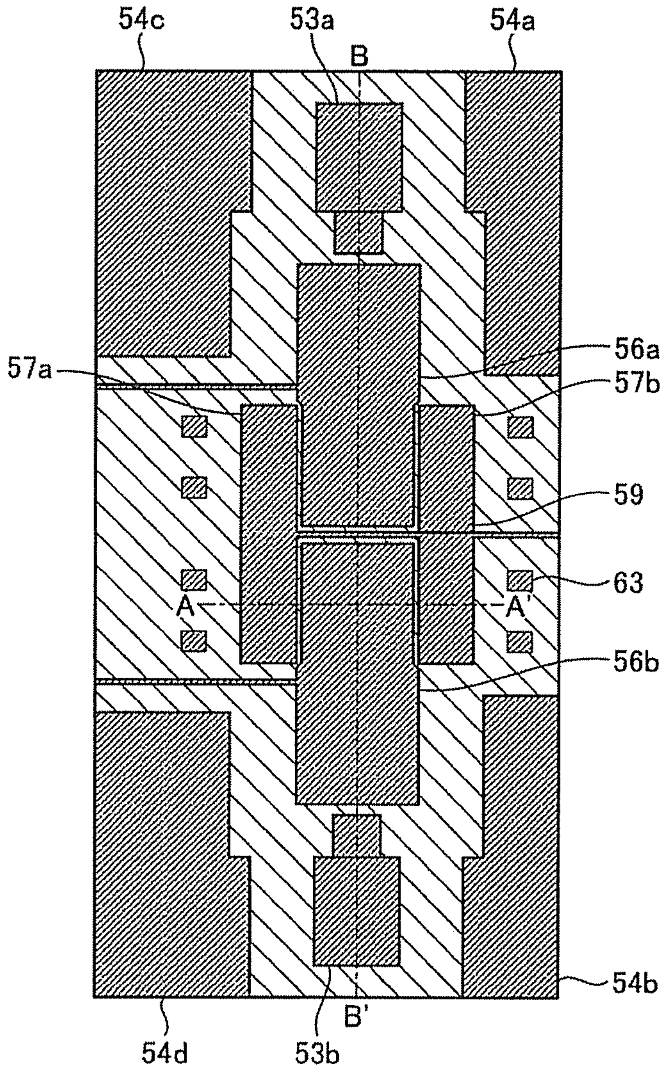
Figure 18C:
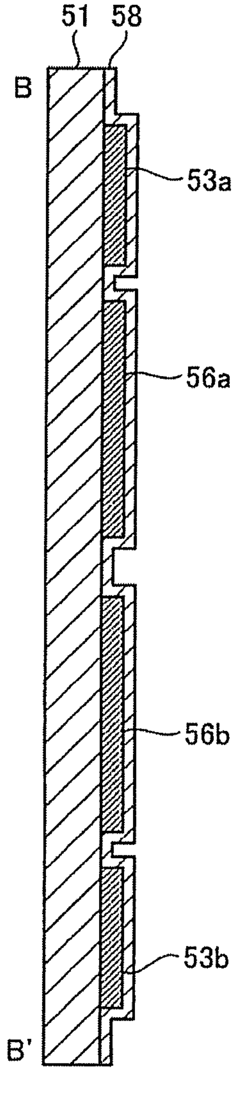
Figure 18B:
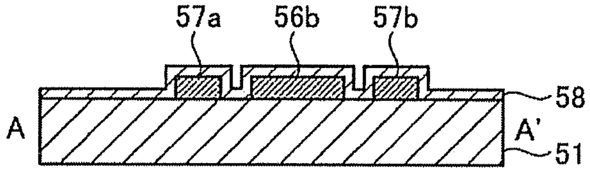

FIG. 18A is a plan view showing a method for manufacturing a micro movable device according to a fifth embodiment of the present invention. FIG. 18B is a cross-sectional view of the micro movable device taken along the A-A' line in FIG. 18A. FIG. 18C is a cross-sectional view of the micro movable device taken along the B-B' line in FIG. 18A.

Figure 19A:
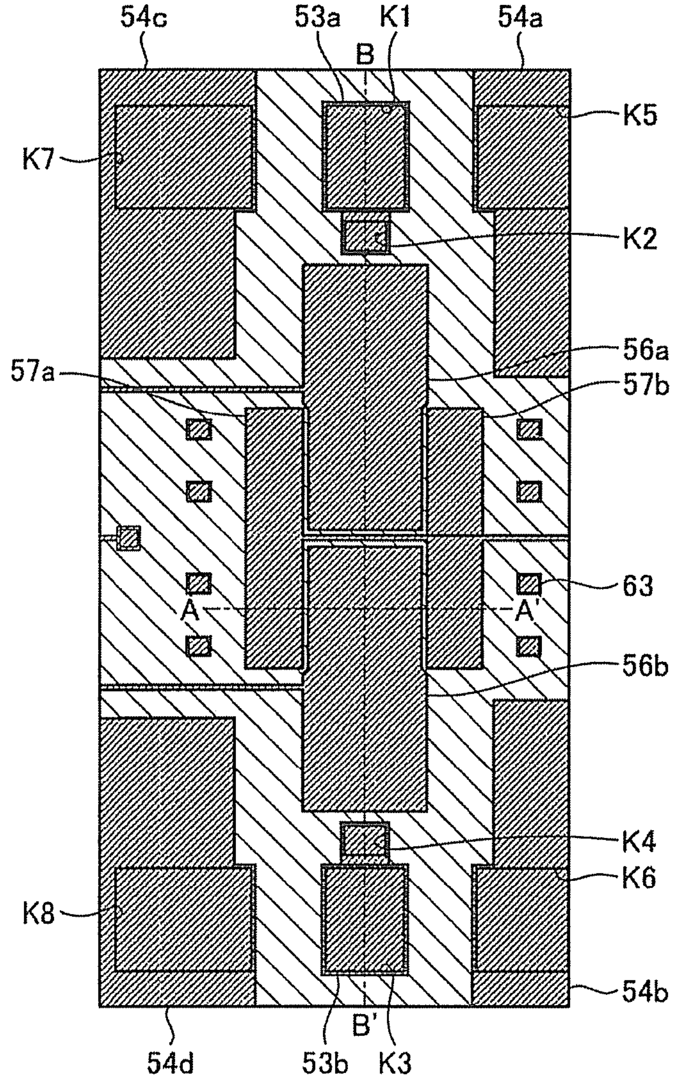
Figure 19C:
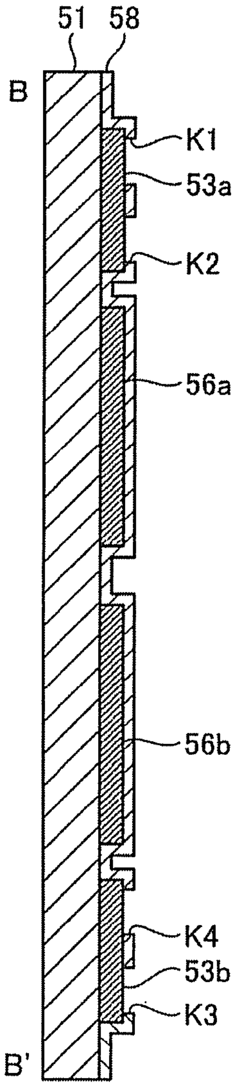
Figure 19B:
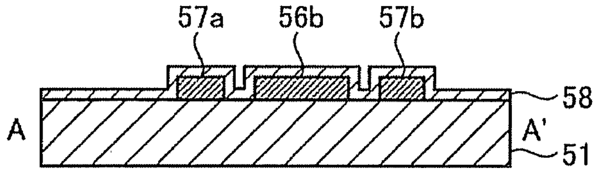

FIG. 19A is a plan view showing the method for manufacturing a micro movable device according to the fifth embodiment of the present invention. FIG. 19B is a cross-sectional view of the micro movable device taken along the A-A' line in FIG. 19A. FIG. 19C is a cross-sectional view of the micro movable device taken along the B-B' line in FIG. 19A.

Figure 20A:
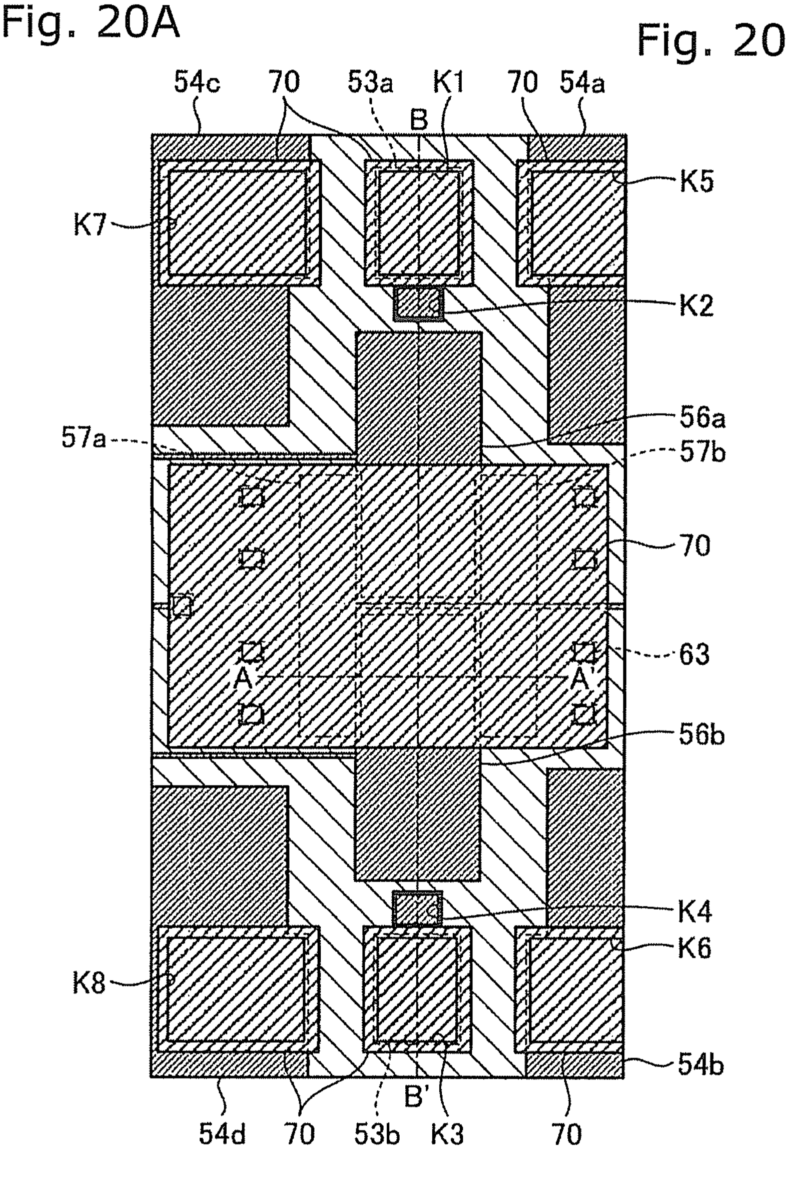
Figure 20C:
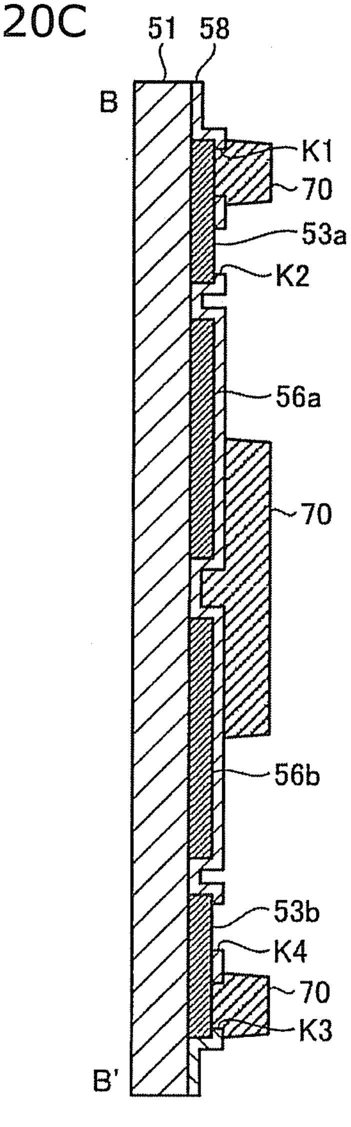
Figure 20B:
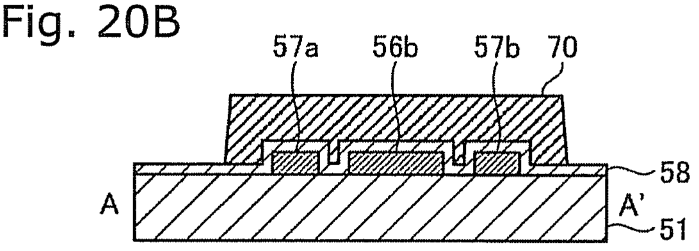

FIG. 20A is a plan view showing the method for manufacturing a micro movable device according to the fifth embodiment of the present invention. FIG. 20B is a cross-sectional view of the micro movable device taken along the A-A' line in FIG. 20A. FIG. 20C is a cross-sectional view of the micro movable device taken along the B-B' line in FIG. 20A.

Figure 21A:
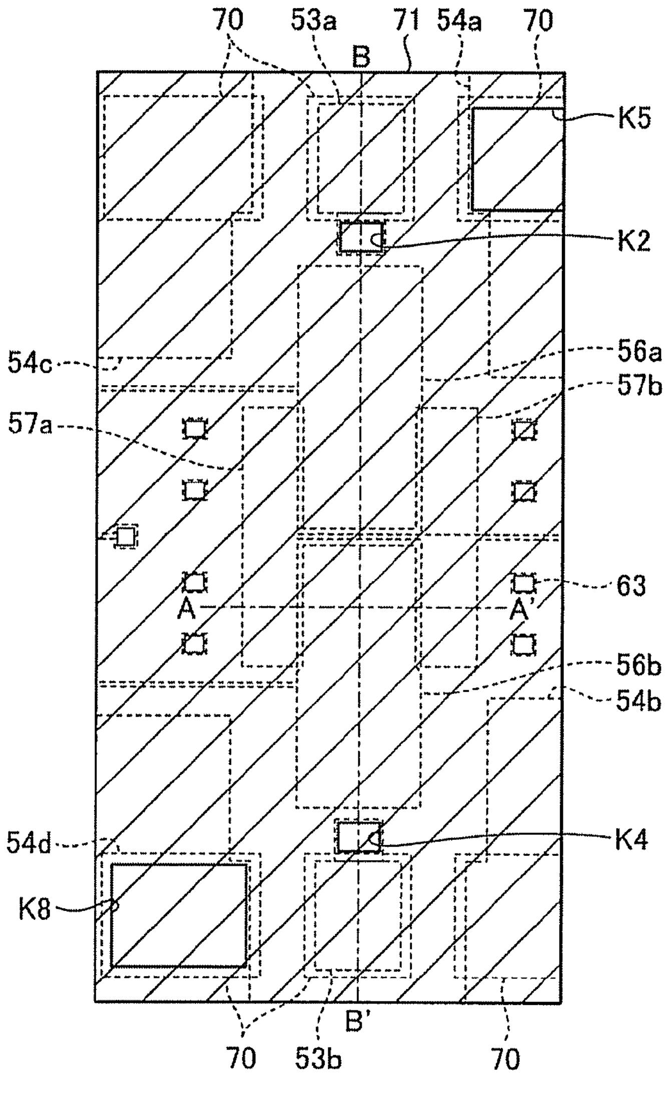
Figure 21C:
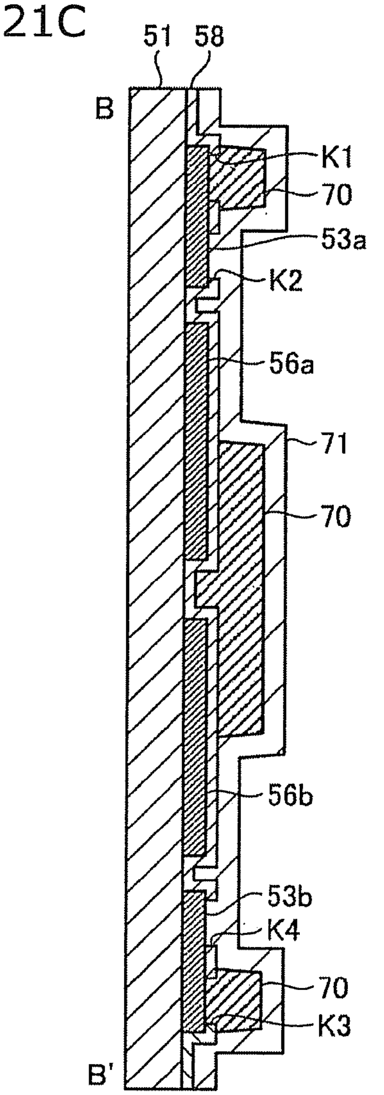
Figure 21B:
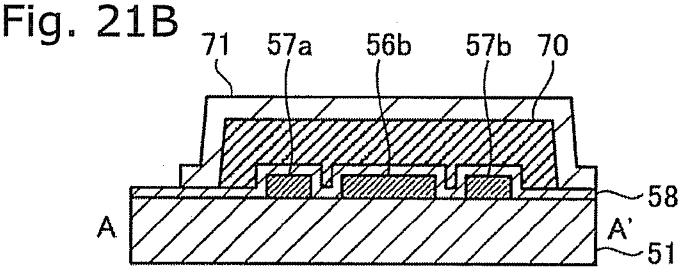

FIG. 21A is a plan view showing the method for manufacturing a micro movable device according to the fifth embodiment of the present invention. FIG. 21B is a cross-sectional view of the micro movable device taken along the A-A' line in FIG. 21A. FIG. 21C is a cross-sectional view of the micro movable device taken along the B-B' line in FIG. 21A.

Figure 22A:
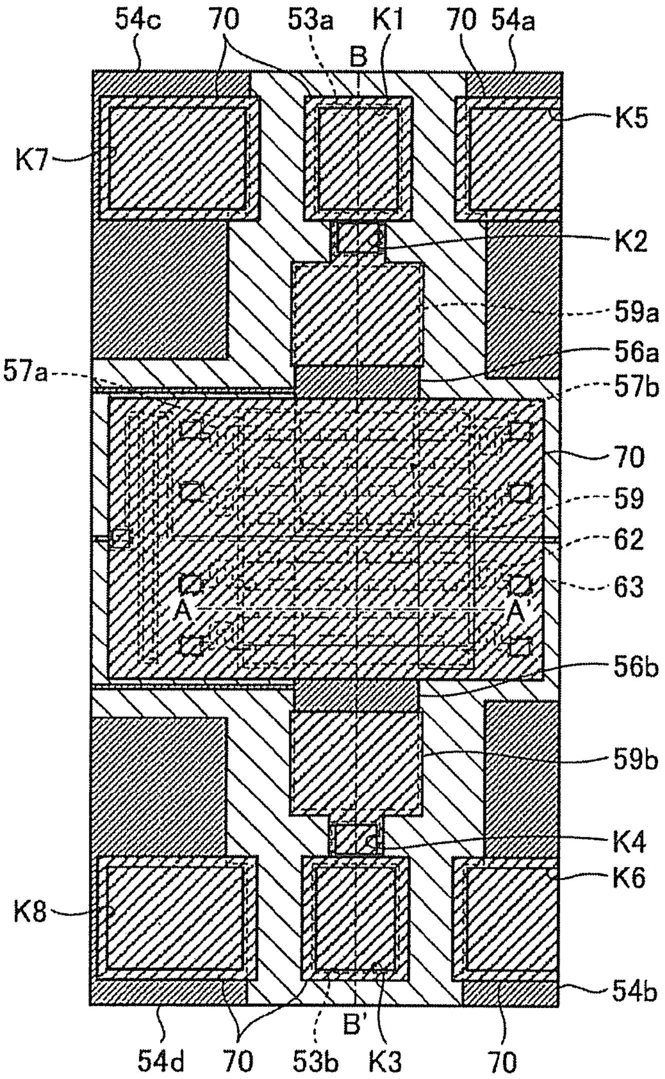
Figure 22C:
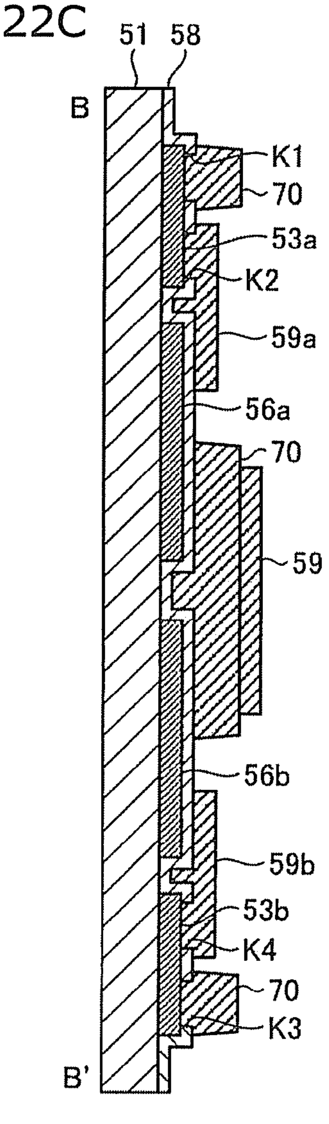
Figure 22B:
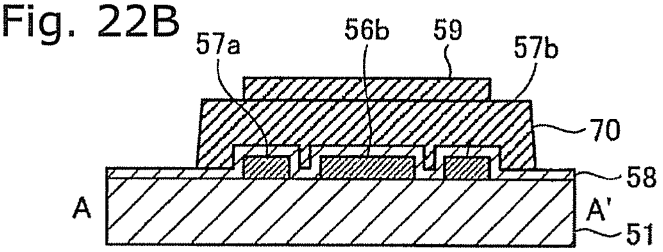

FIG. 22A is a plan view showing the method for manufacturing a micro movable device according to the fifth embodiment of the present invention. FIG. 22B is a cross-sectional view of the micro movable device taken along the A-A' line in FIG. 22A. FIG. 22C is a cross-sectional view of the micro movable device taken along the B-B' line in FIG. 22A.

Figure 23A:
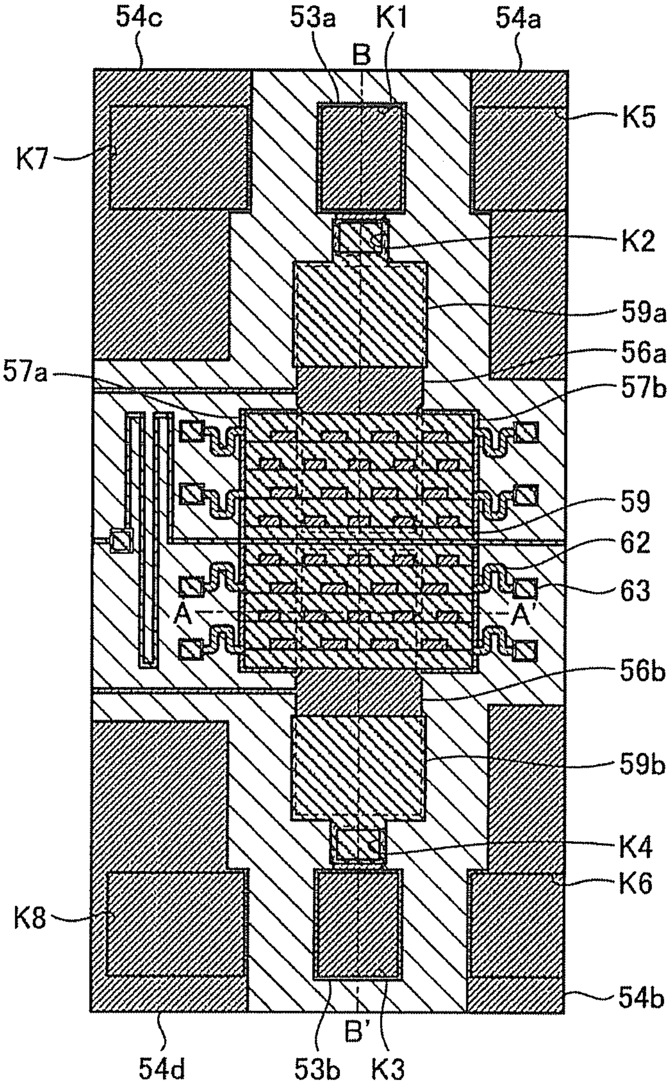
Figure 23C:
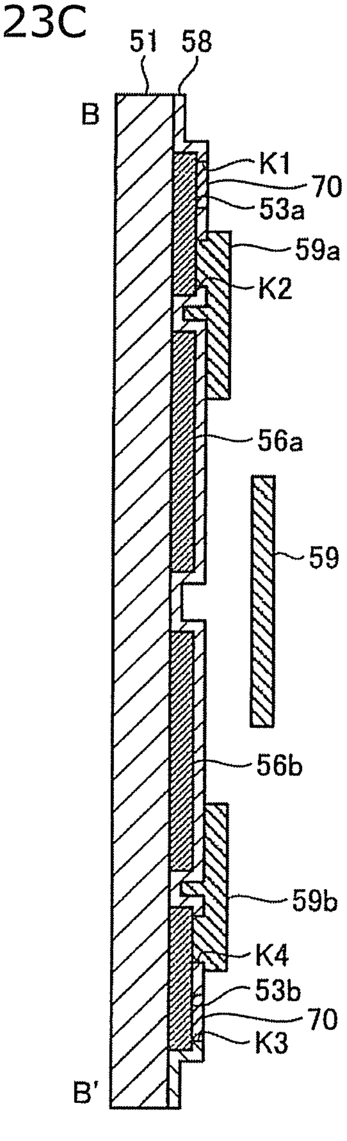
Figure 23B:
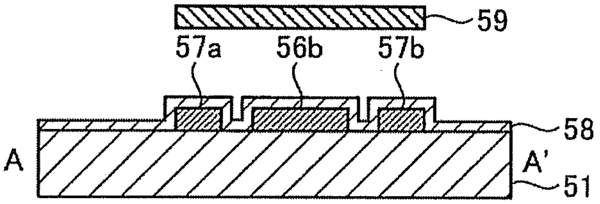

FIG. 23A is a plan view showing the method for manufacturing a micro movable device according to the fifth embodiment of the present invention. FIG. 23B is a cross-sectional view of the micro movable device taken along the A-A' line in FIG. 23A. FIG. 23C is a cross-sectional view of the micro movable device taken along the B-B' line in FIG. 23A.

DETAILED DESCRIPTION

Hereinafter, micro movable devices according to embodiments of the present invention are described by referring to the accompanying drawings. The same components are denoted by the same reference signs, and a description thereof may be omitted.

First Embodiment

Figure 1:
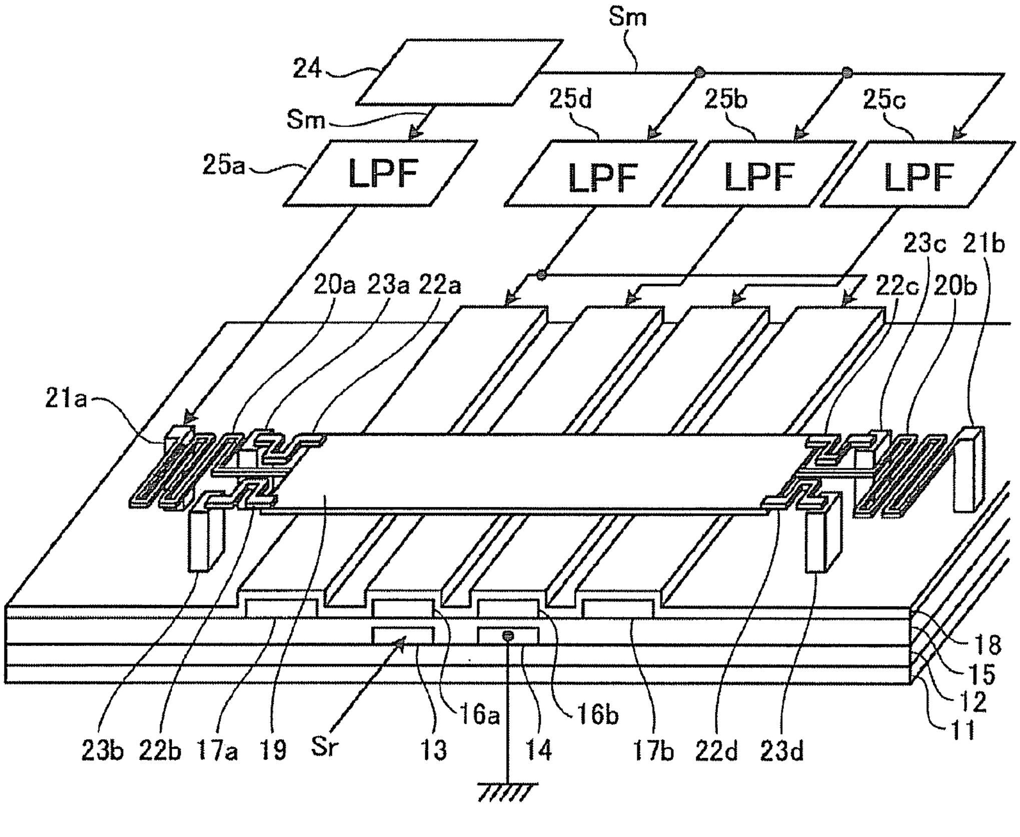
FIG. 1 is a perspective view showing a schematic configuration of a micro movable device according to a first embodiment of the present invention.
Figure 2A:
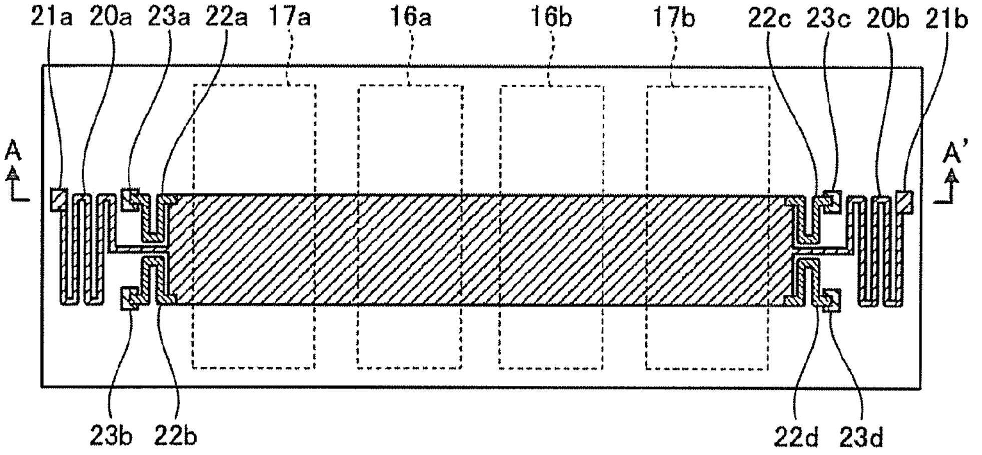
FIG. 2A is a plan view showing a schematic configuration of the micro movable device according to the first embodiment of the present invention.
Figure 2B:
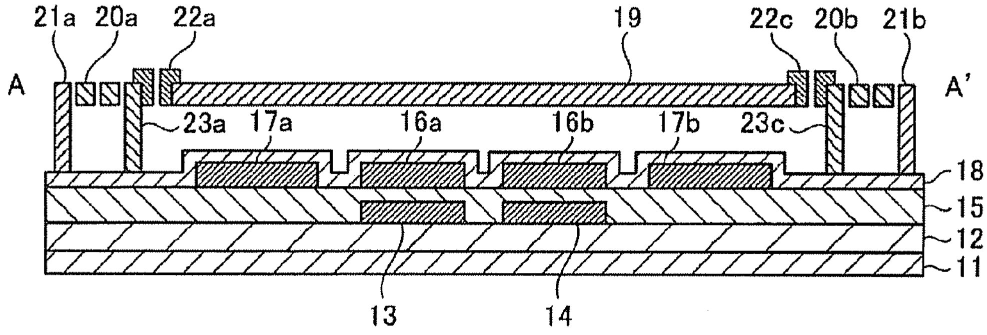
FIG. 2B is a cross-sectional view of the micro movable device taken along the A-A' line in FIG. 2A.

FIG. 1 is a perspective view showing a schematic configuration of a micro movable device according to a first embodiment of the present invention. FIG. 2A is a plan view showing a schematic configuration of a micro movable device according to the first embodiment of the present invention. FIG. 2B is a cross-sectional view of the micro movable device taken along the A-A' line in FIG. 2A.

In FIG. 1 and FIG. 2, an insulating layer 12 is formed on a support substrate 11, and a signal line 13 and a ground (GND) line 14 are formed on the insulating layer 12. Here, the signal line 13 and the ground line 14 are arranged side by side with each other on the insulating layer 12. The signal line 13 may transmit a high-frequency signal Sr such as a radio frequency (RF) signal. As the support substrate 11, a semiconductor substrate made of Si or the like can be used, or an insulative substrate made of glass, ceramics or the like can be used.

Furthermore, an insulating layer 15 is formed on the insulating layer 12 in such a manner as to cover the signal line 13 and the ground line 14, and driving electrodes 16*a*, 16*b* and auxiliary driving electrodes 17*a*, 17*b* are formed on the insulating layer 15. Here, the driving electrode 16*a* is arranged above the signal line 13, and the driving electrode 16*b* is arranged above the ground line 14. The auxiliary driving electrode 17*a* is arranged side by side with the driving electrode 16*a*, and the auxiliary driving electrode 17*b* is arranged side by side with the driving electrode 16*b*.

An insulating layer 18 is formed on the insulating layer 15 in such a manner as to cover the driving electrodes 16*a*, 16*b* and the auxiliary driving electrodes 17*a*, 17*b*. A movable electrode 19 is supported on the insulating layer 18 in such a manner as to cross the driving electrodes 16*a*, 16*b* and the auxiliary driving electrodes 17*a*, 17*b*, being spaced away from the driving electrodes 16*a*, 16*b* and the auxiliary driving electrodes 17*a*, 17*b*. As a material of insulating layers 12, 15 and 18, a silicon oxide film or a silicon nitride film can be used, for example.

Here, supports 23*a* to 23*d* supporting the movable electrode 19 are formed on the insulating layer 18. Then, spring members 22*a* to 22*d* are respectively bridged between the supports 23*a* to 23*d* and four corners of the movable electrode 19, and thereby the movable electrode 19 is supported on the insulating layer 18 to be freely movable up and down. A material of the spring members 22*a* to 22*d* can be a silicon nitride film, for example. Here, in order for the spring members 22*a* to 22*d* to have elasticity, the spring members 22*a* to 22*d* are once folded inward from the four corners of the movable electrode 19 and then folded outward. The spring members 22*a* to 22*d* have a meander in a plan view.

On the insulating layer 18, supports 21*a*, 21*b* for applying a drive signal to the movable electrode 19 is formed. Then, connecting wires 20*a*, 20*b* are bridged between supports 21*a*, 21*b* and a central section of the movable electrode 19 to connect the supports 21*a*, 21*b* and the movable electrode 19.

Here, connecting wires 20*a*, 20*b* have a spring structure with a small spring constant obtained by folding the connecting wires 20*a*, 20*b* in a width direction of the movable electrode 19. The movable electrode 19 is adapted to make DC coupling to the supports 21*a*, 21*b*. The movable electrode 19, the connecting wires 20*a*, 20*b* and the supports 21*a*, 21*b* and 23*a* to 23*d* may be made of the same conductive material. A material of the signal line 13, the ground line 14, the driving electrodes 16*a*, 16*b*, the auxiliary driving electrodes 17*a*, 17*b*, the movable electrode 19, the connecting wires 20*a*, 20*b* and the supports 21*a*, 21*b* and 23*a* to 23*d* may be, for example, a metal such as Al or Cu.

The longitudinal direction of the signal line 13, the ground line 14, the first driving electrode 16*a*, the second driving electrode 16*b*, the first auxiliary driving electrode 17*a* and the second auxiliary driving electrode 17*b* is a vertical direction in FIG. 2A. The longitudinal direction of the movable electrode 19 is horizontal direction in FIG. 2A. So a longitudinal direction of the signal line 13, the ground line 14, the first driving electrode 16*a*, the second driving electrode 16*b*, the first auxiliary driving electrode 17*a* and the second auxiliary driving electrode 17*b* is substantially perpendicular to a longitudinal direction of the movable electrode 19.

Then, the support 21*a* is connected to a drive signal generator 24 via a low pass filter (LPF) 25*a*. The driving electrodes 16*a*, 16*b* are connected to the drive signal generator 24 respectively via low pass filters 25*b* and 25*c*. Also, the auxiliary driving electrodes 17*a*, 17*b* are connected to the drive signal generator 24 via a low pass filter 25*d*. Note that the drive signal generator 24 is capable of generating a drive signal Sm which moves the movable electrode 19 up and down. The low pass filters 25*a* to 25*c* are capable of electrically isolating the high-frequency signal Sr transmitted via the signal line 13 and the drive signal Sm.

Then, when the high-frequency signal Sr is inputted into the signal line 13 and concurrently the drive signal Sm is inputted to the movable electrode 19, the driving electrodes 16*a*, 16*b* and the auxiliary driving electrodes 17*a*, 17*b* via the low pass filters 25*a* to 25*d*. Then, when the drive signal Sm generates a high potential at the movable electrode 19, the driving electrodes 16*a*, 16*b* and the auxiliary driving electrodes 17*a*, 17*b*, the movable electrode 19 is pulled toward the ground line 14, causing a capacitance coupling of the signal line 13 with the ground line 14 via the movable electrode 19. Then, when the signal line 13 makes the capacitance coupling with the ground line 14 via the movable electrode 19, the high-frequency signal Sr flows into the ground line 14 and transmission of the high-frequency signal Sr through the signal line 13 is blocked.

On the other hand, when the drive signal Sm generates a low potential at the movable electrode 19, the driving electrodes 16*a*, 16*b* and the auxiliary driving electrodes 17*a*, 17*b*, electrostatic attraction between the movable electrode 19 and the ground line 14 decreases, which, in turn, increases a gap between the movable electrode 19 and the ground line 14, whereby the high-frequency signal Sr is transmitted through the signal line 13 without flowing into the ground line.

Here, the movable electrode 19 and the driving electrodes 16*a*, 16*b*, which are connected to the drive signal generator 24 respectively via the low pass filters 25*a* to 25*c*, are in a high-frequency floating state. For this reason, the signal line 13 makes the capacitance-coupling with the ground line 14 via a route of the signal line 13, the driving electrode 16*a*, the movable electrode 19, the driving electrode 16*b* and the ground line 14 in this order. As a result, even when the signal line 13 is switched from a down state to an up state with the high-frequency signal Sr inputted to the signal line 13, an effective voltage which is applied between the movable electrode 19 and the driving electrodes 16*a*, 16*b* and which influences the hot switching can be reduced by the capacitance division. Thereby, the self-holding phenomenon holding the movable electrode 19 in a down state can be prevented even though the drive signal Sm is in the low potential.

Also, with the auxiliary driving electrodes 17*a*, 17*b* arranged beside the driving electrodes 16*a*, 16*b*, the electrostatic attraction pulling the movable electrode 19 can be increased without increasing the drive voltage Sm. Thus, the movable electrode 19 can be switched from an up state to a down state even when the spring constant of the spring members 22*a* to 22*d* is increased to prevent the self-holding phenomenon.

The drive voltage Sm can be given from the following mathematical formula (1):

$$Sm=\sqrt{(8k/(27\epsilon_0 S)g_0^3)} \quad (1)$$

Where "k" represents the spring constant; represents the electrode area of the driving electrodes 16*a*, 16*b* and the auxiliary driving electrodes 17*a*, 17*b;* and "$g_0$" represents a gap between the movable electrode 19 and the driving electrodes 16*a*, 16*b* when the movable electrode 19 is in an up state.

With the auxiliary driving electrodes 17*a*, 17*b* arranged beside the driving electrodes 16*a*, 16*b*, the electrode area S in the mathematical formula (1) can be increased, and thereby the drive voltage Sm can be reduced.

Figure 3:
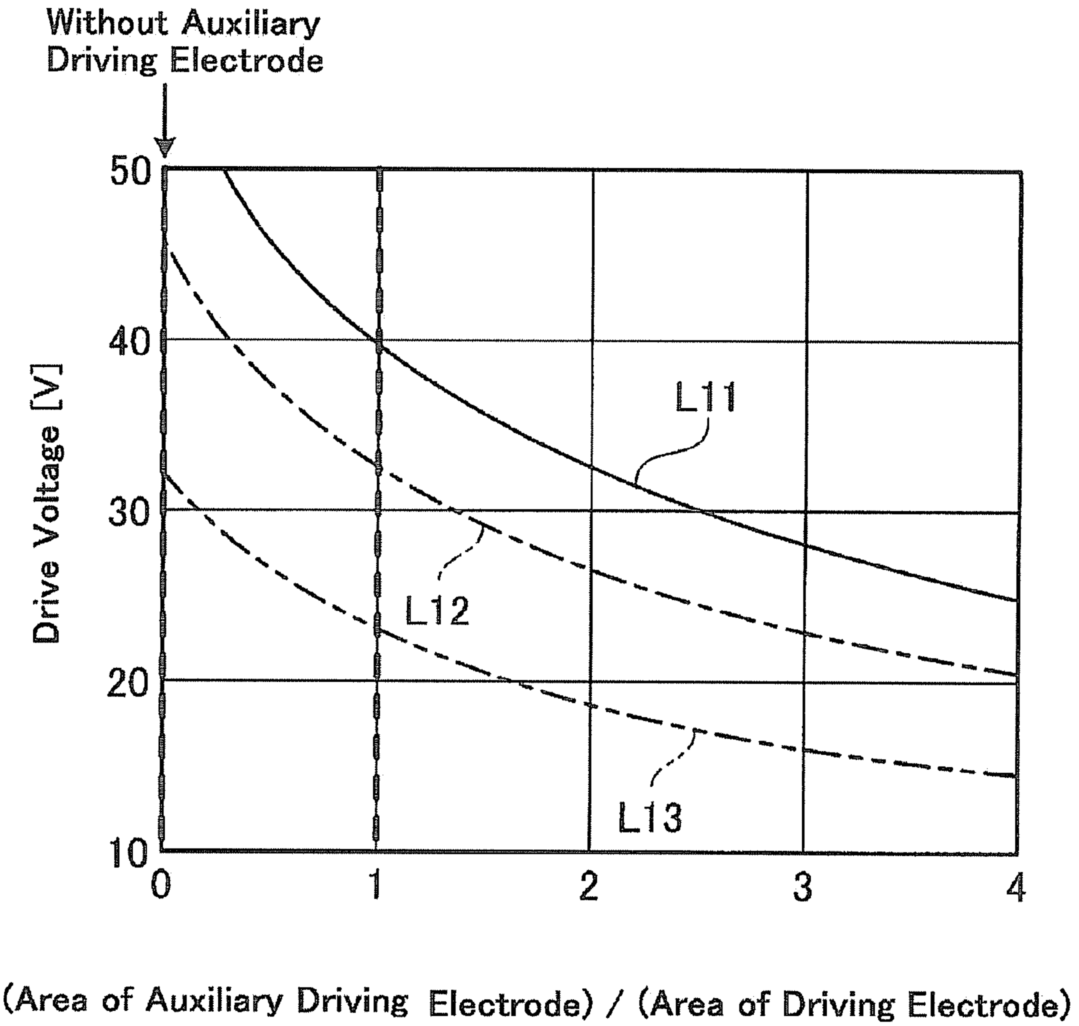
FIG. 3 is a graph showing the dependency of a drive voltage on the area ratio of auxiliary driving electrodes in the micro movable device shown in FIG. 1.

FIG. 3 is a graph showing the dependency of the drive voltage on the area ratio of auxiliary driving electrodes in the micro movable device shown in FIG. 1, wherein L11 shows the area ratio dependency in a case where the spring constant "k" is 120[N/m], L12 shows the area ratio dependency in a case where the spring constant "k" is 80[N/m], and L13 shows the area ratio dependency in a case where the spring constant "k" is 40[N/m].

In FIG. 3, when the electrode area of the auxiliary driving electrodes 17*a*, 17*b* with respect to the electrode area of the driving electrodes 16*a*, 16*b* is increased, the drive voltage Sm decreases whatsoever the spring constant k is. For example, when the electrode area of the driving electrodes 16*a*, 16*b* are equal to the electrode area of the auxiliary driving electrodes 17*a*, 17*b*, the drive voltage Sm decreases by about 30% only.

Figure 4:
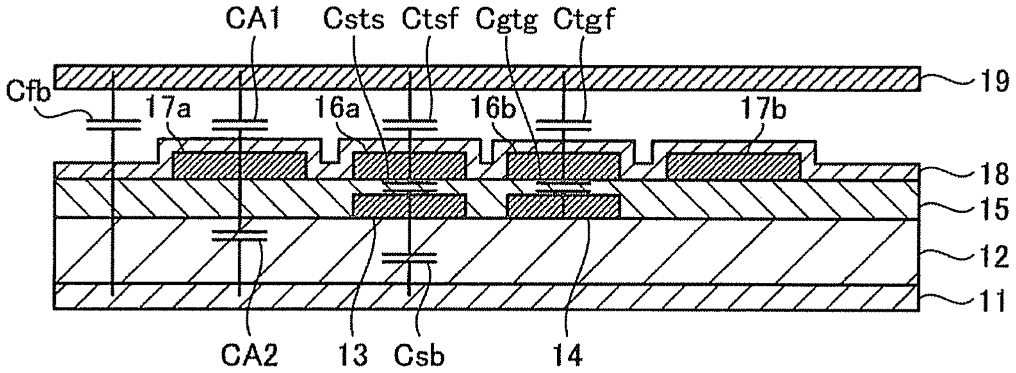
FIG. 4 is a diagram showing capacitances generated at portions of the micro movable device shown in FIG. 1.

FIG. 4 is a diagram showing capacitances formed at the respective elements of the micro movable device shown in FIG. 1.

In FIG. 4, when the auxiliary driving electrodes 17*a*, 17*b* are not provided in the configuration shown in FIG. 1, there exist: a capacitance Csts between the signal line 13 and the driving electrode 16*a*; a capacitance Cgtg between the ground line 14 and the driving electrode 16*b*; a capacitance Ctsf between the driving electrode 16*a* and the movable electrode 19; a capacitance Ctgf between the driving electrode 16*b* and the movable electrode 19; a capacitance Cbs between the signal line 13 and the support substrate 11; and a capacitance Cfb between the movable electrode 19 and the support substrate 11.

Consequently, a capacitance Csg between the signal line 13 and the ground line 14 corresponds to a capacitance generated when the four capacitances Csts, Ctsf, Ctgf and Cgtg are connected in series. Thus, the effective voltage which is applied between the movable electrode 19 and the driving electrodes 16*a*, 16*b* and which influences the hot switching is decreased by the capacitance division.

Here, the capacitance Csg between the signal line 13 and the ground line 14 can be given from the mathematical formula (4) provided below.

$$Csg=Csts\|[Ctsf\|\{Cfb+(Ctgf\|Cgtg)\}]+Csb \quad (4)$$

Meanwhile, when the auxiliary driving electrodes 17*a*, 17*b* are provided, a capacitance CA1 between the movable electrode 19 and the auxiliary driving electrodes 17*a*, 17*b* and a capacitance CA2 between the auxiliary driving electrodes 17*a*, 17*b* and the support substrate 11 are added, so that the capacitances CA1 and CA2 can be observed as an increase of the capacitance Cfb between the movable electrode 19 and the support substrate 11.

Figure 5:
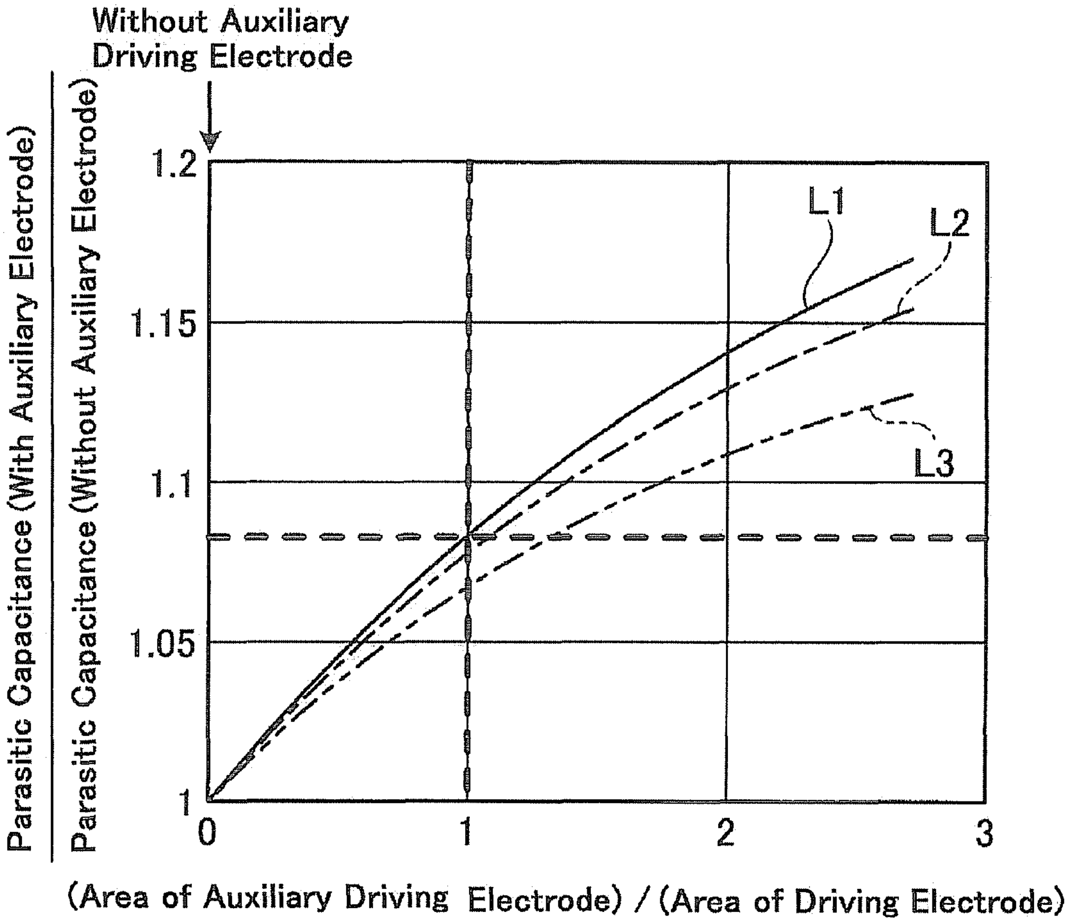
FIG. 5 is a graph showing the dependency of the parasitic capacitance increase ratio on the area ratio of the auxiliary driving electrodes in the micro movable device shown in FIG. 1.

FIG. 5 is a graph showing the dependency of the parasitic capacitance increase ratio on the area ratio of auxiliary driving electrodes in the micro movable device shown in FIG. 1. L1 shows the dependency in a case where the film thickness of the insulating layer 12 is 20 μm, L2 shows the dependency in a case where the film thickness of the insulating layer 12 is 15 μm, and L3 shows the dependency in a case where the film thickness of the insulating layer 12 is 10 μm.

In FIG. 5, when the electrode area of the auxiliary driving electrodes 17*a*, 17*b* with respect to the electrode area of the driving electrodes 16*a*, 16*b* is increased, the parasitic capacitance increases in any film thickness of the insulating layer 12.

However, the increase of the parasitic capacitance with respect to the increase in the electrode area of the auxiliary driving electrodes 17*a*, 17*b* is relatively moderate. For example, when the film thickness of the insulating layer 12 is 20 μm, increase in the parasitic capacitance is about 8% even when the auxiliary driving electrodes 17*a*, 17*b* having the same area as the driving electrodes 16*a*, 16*b* are provided.

Assuming that the capacitances CA1 and CA2 are the capacitance Csg between the signal line 13 and the ground line 14, the capacitances CA1 and CA2 include serial connection elements of the capacitance Ctsf between the driving electrodes 16*a*, 16*b* and the movable electrode 19 and the capacitance CA1 between the movable electrode 19 and the auxiliary driving electrodes 17*a*, 17*b*. Accordingly, capacitance increase is alleviated due to effects of an air space between the insulating layer 18 above the driving electrodes 16*a*, 16*b* and the movable electrode 19 and an air space between the insulating layer 18 above the auxiliary driving electrodes 17*a*, 17*b* and the movable electrode 19.

Second Embodiment

FIG. 6A, FIG. 7A, FIG. 8A, FIG. 9A, FIG. 10A, FIG. 11A, FIG. 12A and FIG. 13A are plan views showing a method for manufacturing a micro movable device according to a second embodiment of the present invention. FIG. 6B, FIG. 7B, FIG. 8B, FIG. 9B, FIG. 10B, FIG. 11B, FIG. 12B and FIG. 13B are cross-sectional views of the micro movable device taken along the A-A' lines in FIG. 6A, FIG. 7A, FIG. 8A, FIG. 9A, FIG. 10A, FIG. 11A, FIG. 12A and FIG. 13A, respectively.

Figure 6A:
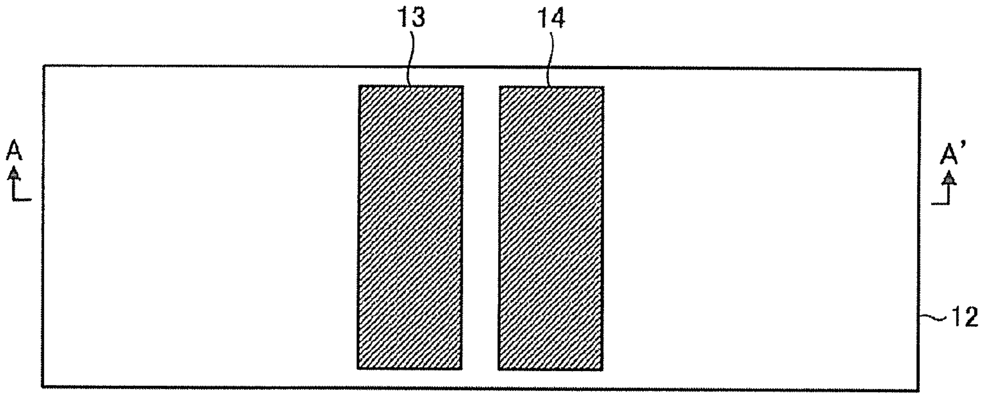
FIG. 6A is a plan view showing a method for manufacturing a micro movable device according to a second embodiment of the present invention.
Figure 6B:
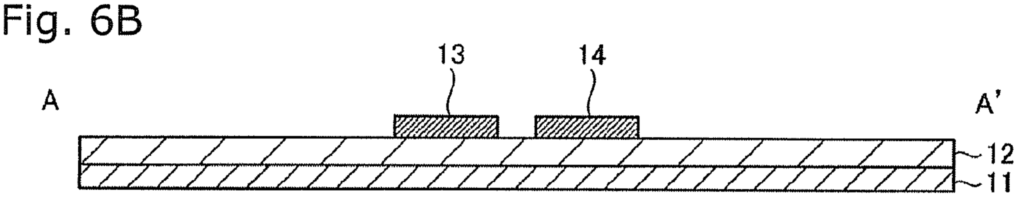
FIG. 6B is a cross-sectional view of the micro movable device taken along the A-A' line in FIG. 6A.

In FIGS. 6A and 6B, an insulating layer 12 is formed on the support substrate 11 using a CVD method or the like. Then, a metal film is formed on the insulating layer 12 using sputtering, a vapor deposition technique or the like. Then, the metal film on the insulating layer 12 is patterned using a photolithography technique and an etching technique so that a signal line 13 and a ground line 14 as shown in FIG. 1 are formed on the insulating layer 12.

Figure 7A:
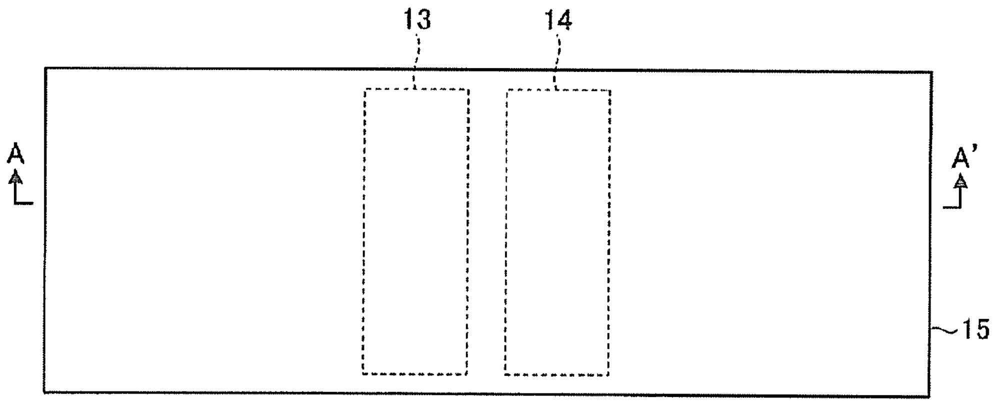
FIG. 7A is a plan view showing the method for manufacturing a micro movable device according to the second embodiment of the present invention.
Figure 7B:
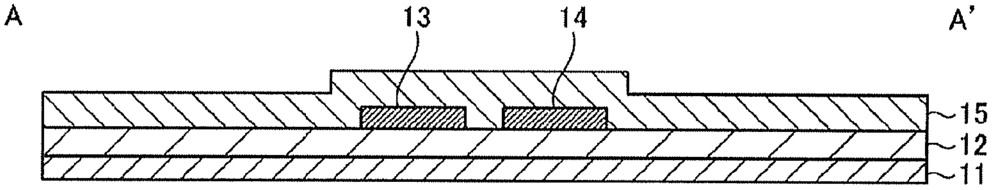
FIG. 7B is a cross-sectional view of the micro movable device taken along the A-A' line in FIG. 7A.

Next, as shown in FIGS. 7A and 7B, an insulating layer 15 covering the signal line 13 and the ground line 14 is deposited on the insulating layer 12 using the CVD method or the like.

Figure 8A:
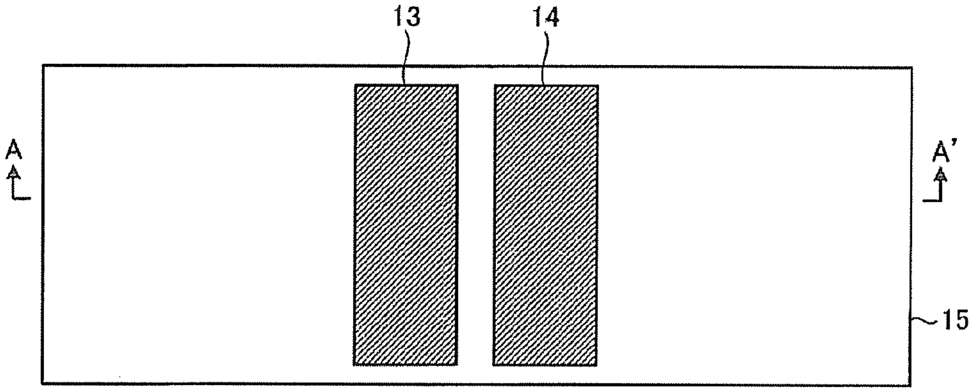
FIG. 8A is a plan view showing the method for manufacturing a micro movable device according to the second embodiment of the present invention.
Figure 8B:
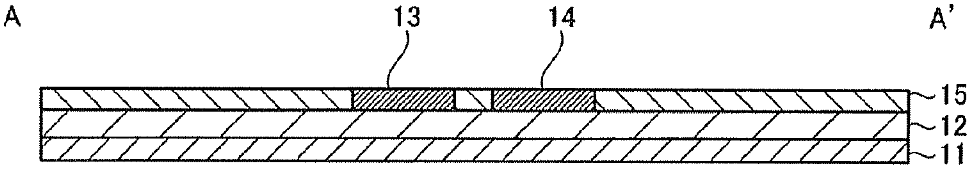
FIG. 8B is a cross-sectional view of the micro movable device taken along the A-A' line in FIG. 8A.

Next, as shown in FIGS. 8A and 8B, the insulating layer 15 is thinned using a CMP method or the like to expose the signal line 13 and the ground line 14 from the insulating layer 15 and to flatten the insulating layer 15.

Figure 9A:
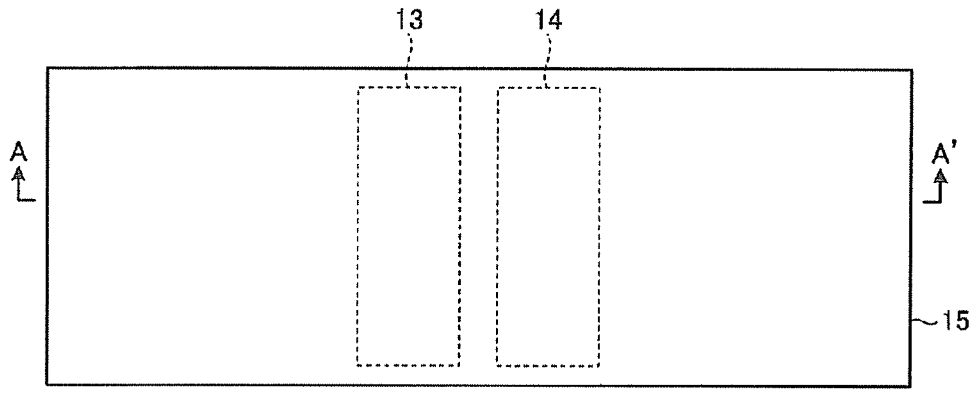
FIG. 9A is a plan view showing the method for manufacturing a micro movable device according to the second embodiment of the present invention.
Figure 9B:
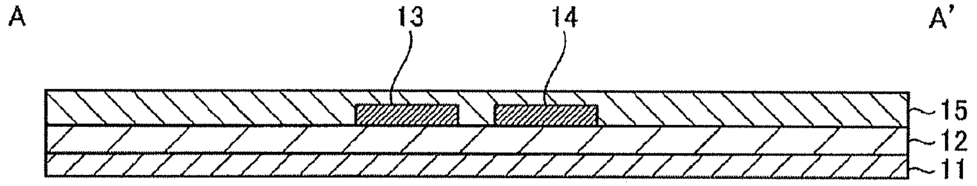
FIG. 9B is a cross-sectional view of the micro movable device taken along the A-A' line in FIG. 9A.

Next, as shown in FIGS. 9A and 9B, the insulating layer 15 is deposited again using the CVD method or the like in such a manner as to cover the signal line 13 and the ground line 14 with the insulating layer 15.

Figure 10A:
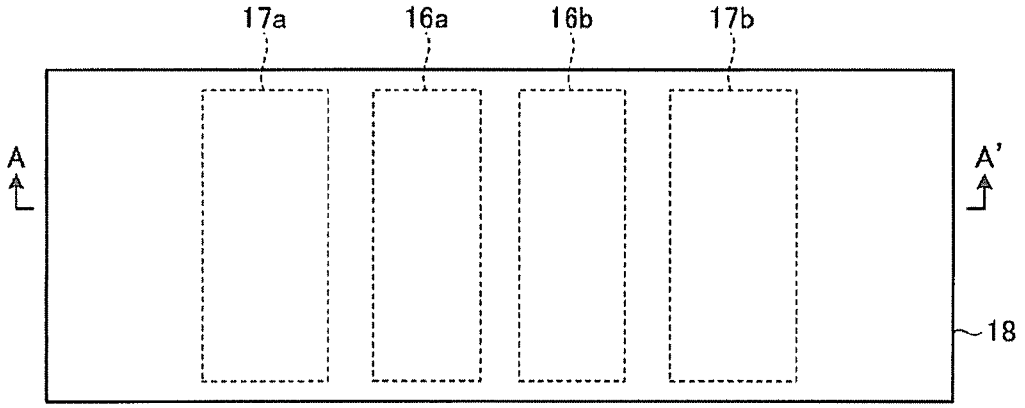
FIG. 10A is a plan view showing the method for manufacturing a micro movable device according to the second embodiment of the present invention.
Figure 10B:
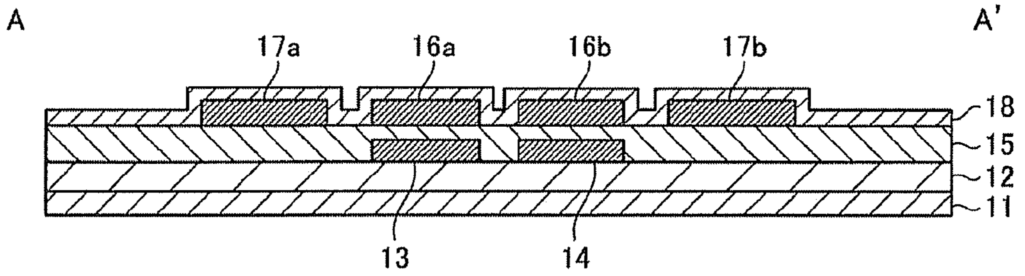
FIG. 10B is a cross-sectional view of the micro movable device taken along the A-A' line in FIG. 10A.

Next, as shown in FIGS. 10A and 10B, a metal film is formed on the insulating layer 15 using sputtering, the vapor deposition technique or the like. Then, the metal film on the insulating layer 15 is patterned using the photolithography technique and the etching technique so that driving electrodes 16*a*, 16*b* and auxiliary driving electrodes 17*a*, 17*b* as shown in FIG. 1 are formed on the insulating layer 15. Then, an insulating layer 18 covering the driving electrodes 16*a*, 16*b* and the auxiliary driving electrodes 17*a*, 17*b* is formed on the insulating layer 15 using the CVD method or the like.

Figure 11A:
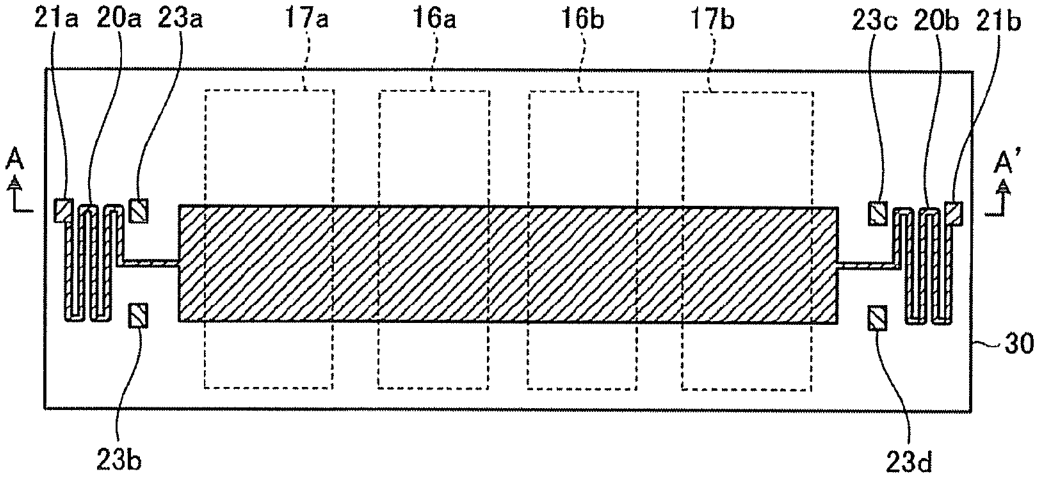
FIG. 11A is a plan view showing the method for manufacturing a micro movable device according to the second embodiment of the present invention.
Figure 11B:
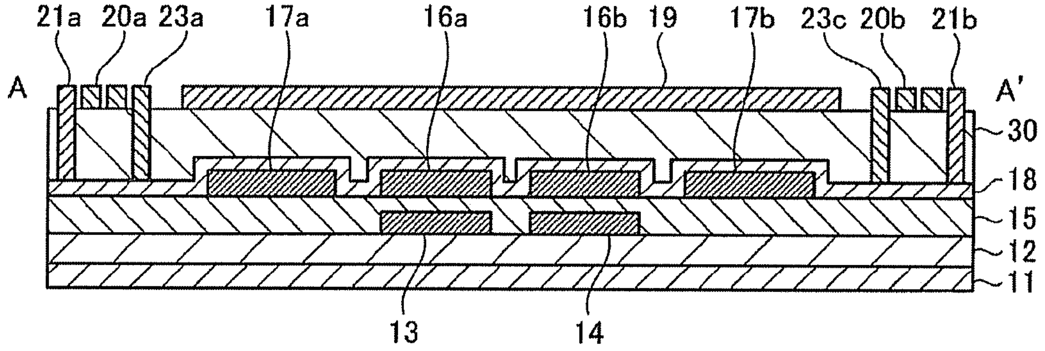
FIG. 11B is a cross-sectional view of the micro movable device taken along the A-A' line in FIG. 11A.

Next, as shown in FIGS. 11A and 11B, a sacrificial film 30 made of photosensitive polyimide, SOG or the like is formed on the insulating layer 18 by a coating method or the like. Then, the sacrificial film 30 is patterned using the photolithography technique and the etching technique to form an opening on the sacrificial film 30, into which supports 21*a*, 21*b* and 23*a* to 23*d* as shown in FIG. 1 are embedded.

Next, a metal film is formed on the sacrificial film 30 using sputtering, the vapor deposition technique or the like so as to fill the opening on the sacrificial film 30. Then, the metal film on the sacrificial film 30 is patterned using the photolithography technique and the etching technique to form an movable electrode 19 and connecting wires 20*a*, 20*b* on the sacrificial film 30 and to form the supports 21*a*, 21*b* and 23*a* to 23*d* embedded into the sacrificial film 30.

Figure 12A:
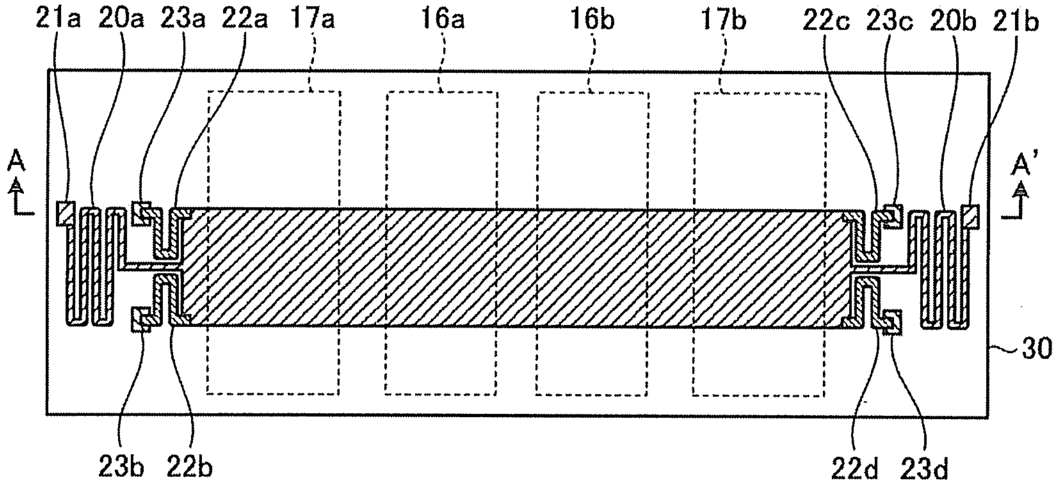
FIG. 12A is a plan view showing the method for manufacturing a micro movable device according to the second embodiment of the present invention.
Figure 12B:
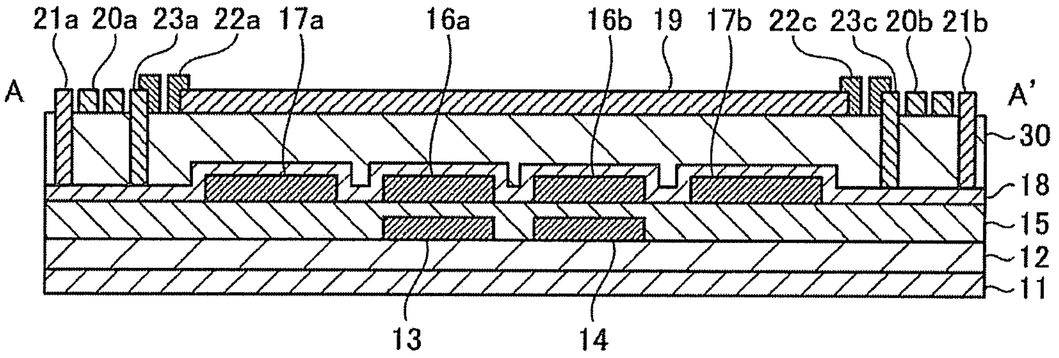
FIG. 12B is a cross-sectional view of the micro movable device taken along the A-A' line in FIG. 12A.

Next, as shown in FIGS. 12A and 12B, an insulating layer is formed on the sacrifice film 30 using the CVD method or the like, the insulating layer covering the movable electrode 19 and the supports 21*a*, 21*b* and 23*a* to 23*d*. Then, the insulating layer on the sacrificial film 30 is patterned using the photolithography technique and the etching technique to form spring members 22*a* to 22*d* connecting between the supports 23*a* to 23*d* and the movable electrode 19, on the sacrificial film 30.

Figure 13A:
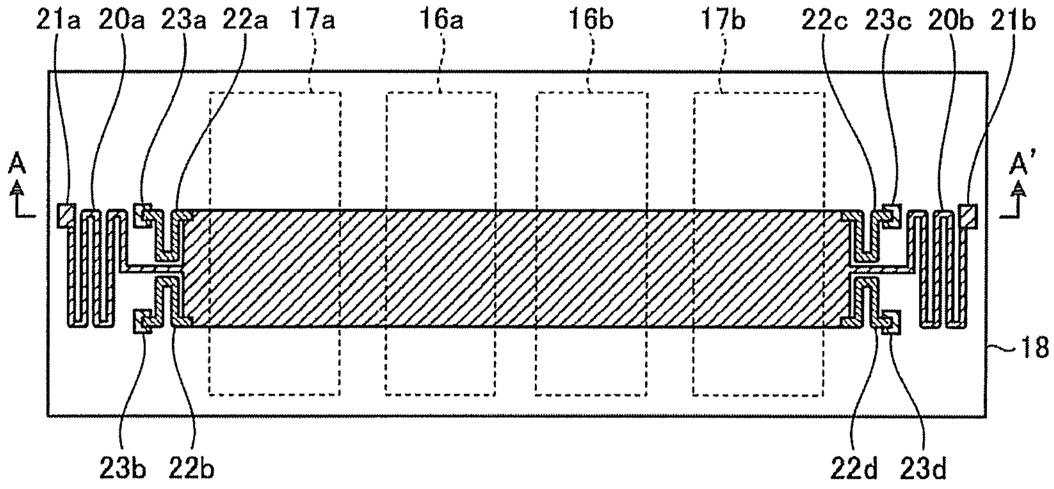
FIG. 13A is a plan view showing the method for manufacturing a micro movable device according to the second embodiment of the present invention.
Figure 13B:
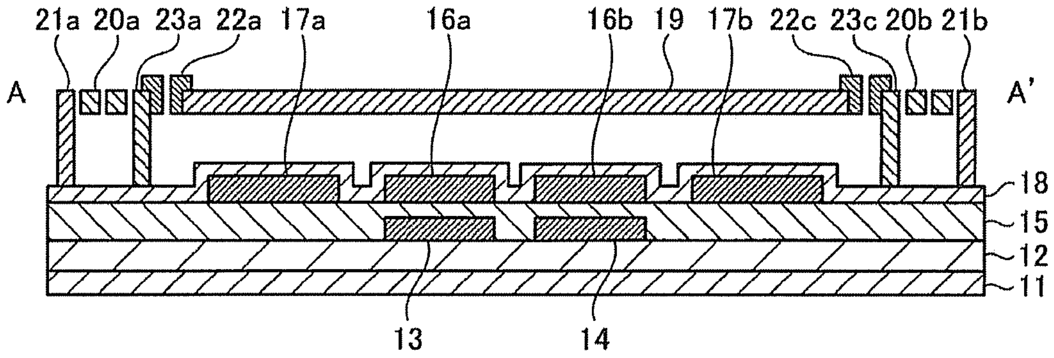
FIG. 13B is a cross-sectional view of the micro movable device taken along the A-A' line in FIG. 13A.

Next, as shown in FIGS. 13A and 13B, the sacrificial film 30 is removed from the support substrate 11 using a wet etching technique or the like to form a space between the movable electrode 19 and the insulating layer 18. Thereby, the micro movable device shown in FIG. 1 is formed.

Third Embodiment

Figure 14A:
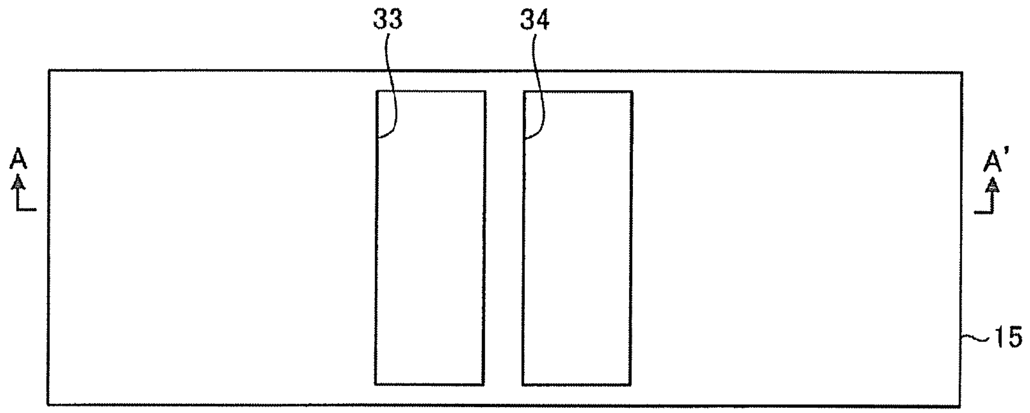
FIG. 14A is a plan view showing a method for manufacturing a micro movable device according to a third embodiment of the present invention.
Figure 14B:
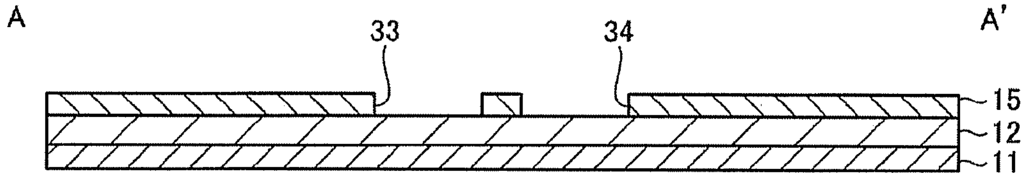
FIG. 14B is a cross-sectional view of the micro movable device taken along the A-A' line in FIG. 14A.
Figure 15A:
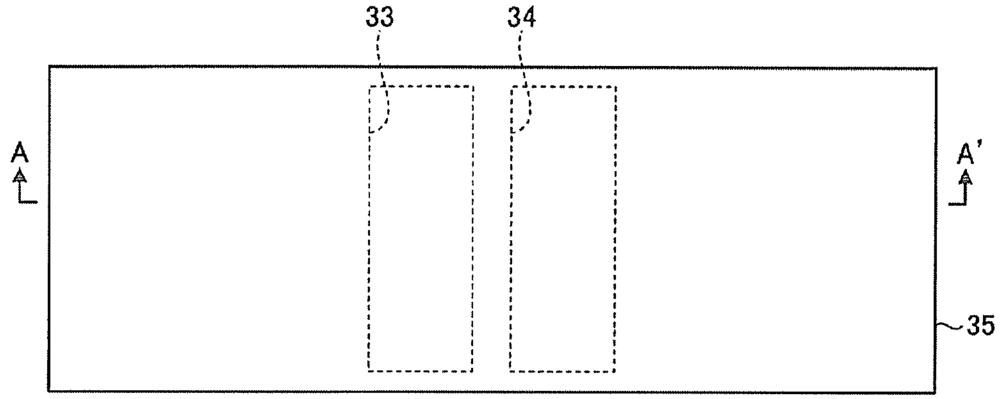
FIG. 15A is a plan view showing the method for manufacturing a micro movable device according to the third embodiment of the present invention.
Figure 15B:
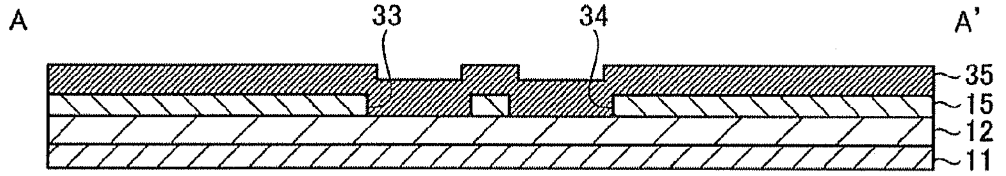
FIG. 15B is a cross-sectional view of the micro movable device taken along the A-A' line in FIG. 15A.
Figure 16A:
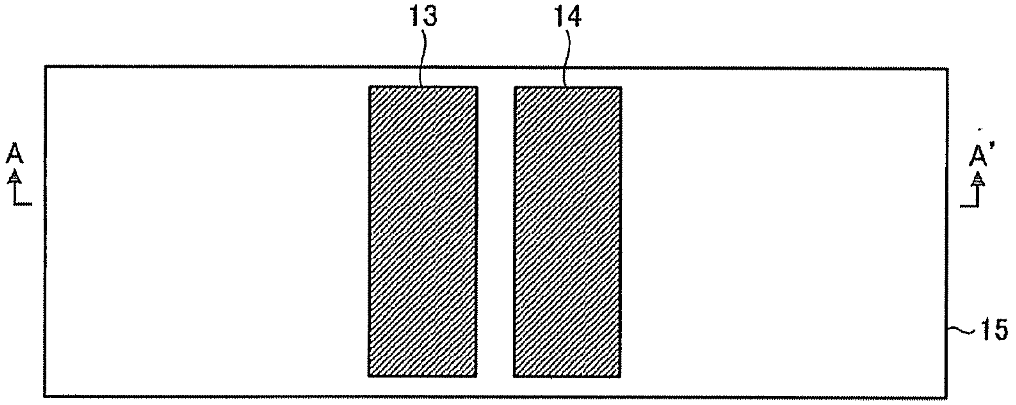
FIG. 16A is a plan view showing the method for manufacturing a micro movable device according to the third embodiment of the present invention.
Figure 16B:
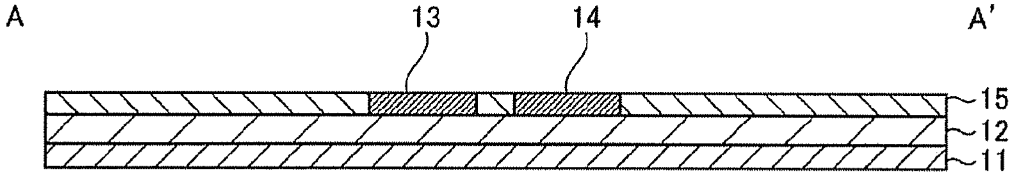
FIG. 16B is a cross-sectional view of the micro movable device taken along the A-A' line in FIG. 16A.

FIG. 14A, FIG. 15A and FIG. 16A are plan views showing a method for manufacturing a micro movable device according to a third embodiment of the present invention. FIG. 14B, FIG. 15B and FIG. 16B are cross-sectional views of the micro movable device taken along the A-A' lines in FIG. 14A, FIG. 15A and FIG. 16A, respectively.

In FIGS. 14A and 14B, insulating layers 12 and 15 are formed sequentially on the support substrate 11 using the CVD method or the like. Then, the insulating layer 15 is patterned using the photolithography technique and the etching technique to form openings 33 and 34 on the insulating layer 15, into which a signal line 13 and a ground line 14 as shown in FIG. 1 are embedded, respectively.

Next, as shown in FIGS. 15A and 15B, a metal film 35 to fill openings 33 and 34 of the insulating layer 15 is formed on the insulating layer 15 using sputtering, the vapor deposition or the like.

Next, as shown in FIGS. 16A and 16B, the metal film 35 is thinned by the CMP method or the like to expose the insulating layer 15, so that the signal line 13 and the ground line 14 respectively embedded into the openings 33 and 34 are formed on the insulating layer 12. Then, steps shown in FIGS. 9A to 13B are performed to form the micro movable device shown in FIG. 1.

Fourth Embodiment

According to this embodiment, suppression of increase in parasitic capacitance between a signal line and a drive line is achieved by making the signal line also serve as the drive line.

FIG. 17A is a plan view showing a configuration of a micro movable device according to the fourth embodiment of the present invention. FIG. 17B is a cross-sectional view of the micro movable device taken along the A-A' line in FIG. 17A. FIG. 17C is a cross-sectional view of the micro movable device taken along the B-B' line in FIG. 17A.

In FIGS. 17A to 17C, signal-line/driving electrodes 56*a*, 56*b* are formed on a support substrate 51. Here, the signal-line/driving electrodes 56*a*, 56*b* are arranged side by side with each other. Signal lines 53*a*, 53*b* are arranged side by side with each other at the front and the back of the signal-line/driving electrodes 56*a*, 56*b*. Auxiliary driving electrodes 57*a*, 57*b* are arranged side by side with each other at the left and the right of the signal-line/driving electrodes 56*a*, 56*b*, as shown in FIGS. 17A and 17B. Here, the signal-line/driving electrodes 56*a*, 56*b* are set in a planar shape in such a manner as to project from the auxiliary driving electrodes 57*a*, 57*b* toward the signal lines 53*a*, 53*b*, as shown in FIG. 17A. The signal-line/driving electrodes 56*a*, 56*b* are extended from a portion below a movable electrode 59 to upward to the signal lines 53*a* and downward to the signal lines 53*b*.

On the support substrate 51, ground electrodes 54*a* to 54*d* are arranged at four corners of the signal-line/driving electrodes 56*a*, 56*b*.

On the support substrate 51, an insulating layer 58 is deposited in such a manner as to cover the signal lines 53*a*, 53*b*, the signal-line/driving electrodes 56*a*, 56*b*, the auxiliary driving electrodes 57*a*, 57*b* and the ground electrodes 54*a* to 54*d*. A wiring 59*a* is formed on the insulating layer 58. The wiring 59*a* is connected to the signal line 53*a* via an opening K2 and arranged opposite to a part of the signal-line/driving electrode 56*a* via the insulating layer 58 interposed in between. In addition, a wiring 59*b* is formed on the insulating layer 58. The wiring 59*b* is connected to the signal line 53*b* via an opening K4 and arranged opposite to part of the signal-line/driving electrode 56*b* via the insulating layer 58 interposed in between.

A movable electrode 59 is supported on the insulating layer 58, with a gap, in such a manner as to face the auxiliary driving electrodes 57*a*, 57*b* and the signal-line/driving electrodes 56*a*, 56*b* arranged between the auxiliary driving electrodes 57*a*, 57*b*.

Meanwhile, supports 63 supporting the movable electrode 59 are formed on the insulating layer 58. Spring members 62 are bridged between the supports 63 and the movable electrode 59, and thereby the movable electrode 59 is supported on the insulating layer 58 to be freely movable up and down.

A capacitance Csts1 is generated between the wiring 59*a* and the signal-line/driving electrode 56*a*, a capacitance Csts2 is generated between the wiring 59*b* and the signal-line/driving electrode 56*b*, a capacitance Ctsf is generated between the movable electrode 59 and the signal-line/driving electrode 56*a*, and a capacitance Ctgf is generated between the movable electrode 59 and the signal-line/driving electrode 56*b*.

Then, when a drive signal generates a high potential at the movable electrode 59, the signal-line/driving electrodes 56*a*, 56*b* and the auxiliary driving electrodes 57*a*, 57*b*, the movable electrode 59 is pulled toward the signal-line/driving electrodes 56*a*, 56*b*, and the signal-line/driving electrodes 56*a*, 56*b* make capacitance coupling with each other via the movable electrode 59. Then, when being inputted from Sig1 is outputted, a high-frequency signal is outputted from Sig2 through the signal line 53*a*, the wiring 59*a*, the signal-line/driving electrode 56*a*, the movable electrode 59, the signal-line/driving electrode 56*b*, the wiring 59*b* and the signal line 53*b* in this order.

Meanwhile, transmission of the high-frequency signal from the wiring 59*a* to the signal-line/driving electrode 56*a* is made by capacitance coupling of the capacitance Csts1 via the insulating layer 58. Transmission of the high-frequency signal from the signal-line/driving electrode 56*a* to the movable electrode 59 is made by capacitance coupling of the capacitance Ctsf via the insulating layer 58. Transmission of the high-frequency signal from the movable electrode 59 to the signal-line/driving electrode 56*b* is made by capacitance coupling of the capacitance Ctgf via the insulating layer 58. Transmission of the high-frequency signal from the signal-line/driving electrode 56*b* to the wiring 59*b* is made by capacitance coupling of the capacitance Csts2 via the insulating layer 58.

Since the capacitances Csts1, Ctsf, Ctgf and Csts2 are connected in series, the effective voltage which is applied between the movable electrode 59 and the signal-line/driving electrodes 56*a*, 56*b* and which influences the hot switching can be reduced by capacitance division similarly as in the first embodiment.

In the fourth embodiment, increase of the parasitic capacitance with respect to increase in the electrode area of the auxiliary driving electrodes 57*a*, 57*b* is relatively moderate, as in the first embodiment. Thus, through less metal film forming steps, a micro movable device can be obtained which is capable of reducing the drive voltage driving the movable electrode 59 while suppressing increase of the parasitic capacitance between the signal lines 53*a*, 53*b* and the signal-line/driving electrodes 56*a*, 56*b*. In the first embodiment, the micro movable device is formed through the metal-film forming steps for three layers of: a first layer including the signal line 13 and the ground line 14; a second layer including the driving electrodes 16*a*, 16*b* and the auxiliary driving electrodes 17*a*, 17*b*; and a third layer including the movable electrode 19 and the like. In contrast in the fourth embodiment, the micro movable device is formed through metal-film forming steps for two layers of: a first layer including the signal lines 53*a*, 53*b*, signal-line/driving electrodes 56*a*, 56*b* and the auxiliary driving electrodes 57*a*, 57*b*; and a second layer including the movable electrode 59 and the like. Thus, the manufacturing process can be simplified.

Fifth Embodiment

FIG. 18A, FIG. 19A, FIG. 20A, FIG. 21A, FIG. 22A and FIG. 23A are plan views showing a method for manufacturing a micro movable device according to a fifth embodiment of the present invention. FIG. 18B, FIG. 19B, FIG. 20B, FIG. 21B, FIG. 223 and FIG. 233 are cross-sectional views of the micro movable device taken along the A-A' line in FIG. 18A, FIG. 19A, FIG. 20A, FIG. 21A, FIG. 22A and FIG. 23A, respectively. FIG. 18C, FIG. 19C, FIG. 20C, FIG. 21C, FIG. 22C and FIG. 23C are cross-sectional views of the micro movable device taken along the B-B' line in FIG. 18A, FIG. 19A, FIG. 20A, FIG. 21A, FIG. 22A and FIG. 23A, respectively.

In FIGS. 18A to 18C, a metal film is formed on the support substrate 51 using sputtering, the vapor deposition or the like. Then, the metal film on the support substrate 51 is patterned using the photolithography technique and the etching technique to form signal lines 53*a*, 53*b*, signal-line/driving electrodes 56*a*, 56*b* and auxiliary driving electrodes 57*a*, 57*b* on the support substrate 51. Then, using the CVD method or the like, an insulating layer 58 is formed on the support substrate 51, the insulating layer 58 coating the signal lines 53*a*, 53*b*, the signal-line/driving electrodes 56*a*, 56*b* and the auxiliary driving electrodes 57*a*, 57*b*.

As shown in FIGS. 19A to 19C, the insulating layer 58 is patterned using the photolithography technique and the etching technique to form openings K1 to K8 on the insulating layer 58, through which the signal lines 53*a*, 53*b* and the ground electrodes 54*a* to 54*d* are exposed.

Next, as shown in FIGS. 20A to 20C, a sacrificial film 70 made of photosensitive polyimide, SOG or the like is formed on the insulating layer 58 using a coating method or the like. Then, the sacrificial film 70 is patterned using the photolithography technique and the etching technique so that the sacrificial film 70 is removed except for regions on which the movable electrode 59 and the spring members 62 are formed and which are above the openings K1, K3 and K5 to K9.

Next, as shown in FIGS. 21A to 21C, a metal film 71 is formed on the insulating layer 58 in such a manner as to cover the sacrificial film 70, using sputtering, the vapor deposition or the like. At this time point, the openings K2 and K4 in the insulating layer 58 are filled with the metal film 71.

Next, as shown in FIGS. 22A to 22C, the metal film 71 is patterned using the photolithography technique and the etching technique to form a movable electrode 59 on the sacrificial film 70 and to form signal lines 53*a*, 53*b* connected to the signal lines 53*a*, 53*b* via the openings K2 and K4, respectively.

Simultaneously, the metal film 71 is patterned to form, on the insulating layer 58, supports 63 embedded into the sacrificial film 70. Then, an insulating layer is formed and then patterned to form, on the sacrificial film 70, spring members 62 connecting the supports 63 and the movable electrode 59.

Next, as shown in FIGS. 23A to 23C, the sacrificial film 70 is removed from the support substrate 51 using a dry etching method or the like, and a space is formed between the movable electrode 59 and the insulating layer 58 to form the micro movable device shown in FIG. 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A micro movable device, comprising:

a support substrate;

a signal line formed on the support substrate;

a ground line formed on the support substrate and arranged side by side with the signal line;

an insulating layer formed so as to cover the signal line and the ground line;

a first driving electrode formed on the insulating layer and above the signal line;

a second driving electrode formed on the insulating layer and above the ground line, the second driving electrode being arranged side by side with the first driving electrode;

a first auxiliary driving electrode arranged side by side with the first driving electrode;

a second auxiliary driving electrode arranged side by side with the second driving electrode; and a movable electrode which is formed above the first driving electrode, the second driving electrode, the first auxiliary driving electrode and the second auxiliary driving electrode with a space provided between the movable electrode and the first driving electrode, the second driving electrode, the first auxiliary driving electrode, and the second auxiliary driving electrode, the movable electrode being supported on the support substrate.

2. The micro movable device according to claim 1, further comprising:

a drive signal generator which generates a drive signal driving the movable electrode and supplies the drive signal to the first driving electrode, the second driving electrode, the first auxiliary driving electrode and the second auxiliary driving electrode; and low pass filter which are inserted between the drive signal generator and the first auxiliary driving electrode and between the drive signal generator and the second auxiliary driving electrode and which block a high-frequency signal transmitted through the signal line.

3. The micro movable device according to claim 1, further comprising:

a support member which supports the movable electrode above the first driving electrode, the second driving electrode, the first auxiliary driving electrode and the second auxiliary driving electrode with a space therebetween; and a spring member which is bridged between the movable electrode and the support and connects the movable electrode to the support in such a manner that the movable electrode freely moves up and down.

4. The micro movable device according to claim 1, wherein a longitudinal direction of the signal line, the ground line, the first driving electrode, the second driving electrode, the first auxiliary driving electrode and the second auxiliary driving electrode is substantially perpendicular to a longitudinal direction of the movable electrode.

5. The micro movable device according to claim 1, wherein an insulating layer is formed between the first driving electrode and the signal line, and between the second driving electrode and the ground line.

6. The micro movable device according to claim 1, wherein the first auxiliary driving electrode and the second auxiliary driving electrode are nearer to a supported portion of the movable electrode than the first driving electrode and the second driving electrode in a plan view.

7. The micro movable device according to claim 1, wherein an area of the first auxiliary driving electrode facing to the movable electrode and an area of the second auxiliary driving electrode facing to the movable electrode are greater than an area of the first driving electrode facing to the movable electrode and an area of the second driving electrode facing to the movable electrode.

* * * * *